United States Patent
Kataoka

(10) Patent No.: US 7,696,441 B2
(45) Date of Patent: Apr. 13, 2010

(54) FLEXIBLE WIRED CIRCUIT BOARD

(75) Inventor: Kouji Kataoka, Osaka (JP)

(73) Assignee: Nitto Denko Corporation, Osaka (JP)

( * ) Notice: Subject to any disclaimer, the term of this patent is extended or adjusted under 35 U.S.C. 154(b) by 71 days.

(21) Appl. No.: 11/638,475

(22) Filed: Dec. 14, 2006

(65) Prior Publication Data

US 2007/0141864 A1      Jun. 21, 2007

(30) Foreign Application Priority Data

Dec. 15, 2005    (JP)    ............... 2005-361871

(51) Int. Cl.
*H05K 1/00*    (2006.01)
(52) U.S. Cl. ................ 174/254; 361/749
(58) Field of Classification Search ........... 174/254; 361/749
See application file for complete search history.

(56) References Cited

U.S. PATENT DOCUMENTS

| | | | | |
|---|---|---|---|---|
| 4,435,740 A | * | 3/1984 | Huckabee et al. | ............ 361/749 |
| 4,587,719 A | * | 5/1986 | Barth | ............ 438/113 |
| 4,687,695 A | * | 8/1987 | Hamby | ............ 428/192 |
| 5,023,498 A | * | 6/1991 | Abe | ............ 310/71 |
| 5,398,163 A | * | 3/1995 | Sano | ............ 361/749 |
| 5,914,179 A | * | 6/1999 | Inaba | ............ 428/209 |
| 6,153,832 A | * | 11/2000 | Gaarder | ............ 174/254 |
| 7,211,735 B2 | * | 5/2007 | Kaneda | ............ 174/254 |

FOREIGN PATENT DOCUMENTS

JP    2002-217503    8/2002

* cited by examiner

*Primary Examiner*—Ishwarbhai B Patel
(74) *Attorney, Agent, or Firm*—Jean C. Edwards, Esq.; Akerman Senterfitt

(57) ABSTRACT

A flexible wired circuit board that is provided can improve the yield per sheet and the production efficiency of the wired circuit board and thus to reduce the production costs when a plurality of flexible wired circuit boards are formed and aligned on the sheet. The flexible wired circuit board includes a first wired circuit board portion having a first terminal portion, a second wired circuit board portion having a second terminal portion, and a connecting portion for connecting the first wired circuit board portion and the second wired circuit board portion. The first wired circuit board portion and the second wired circuit board portion are disposed adjacent to each other at one end of the connecting portion, and the first wired circuit board portion is foldable over the other end with respect to the connecting portion.

3 Claims, 5 Drawing Sheets

(a)

(b)

(c)

(d)

(e)

FLEXIBLE WIRED CIRCUIT BOARD

CROSS REFERENCE TO RELATED APPLICATION

This application claims priority benefits on the basis of Japanese Patent Application No. 2005-361871 filed on Dec. 15, 2005, the disclosure of which is incorporated herein by reference.

BACKGROUND OF THE INVENTION

1. Field of the Invention

The present invention relates to a flexible wired circuit board and, more particularly, to a flexible wired circuit board that is mounted to an electrical and electronic apparatus.

2. Description of the Related Art

In the manufacturing of a printed circuit board, it is known to form a plurality of printed circuit boards in a generally identical shape on a worksheet which can yield many printed circuit boards thereon. (Japanese Unexamined Patent Publication No. 2002-217503, for example).

In a flexible wired circuit board, terminal portions are formed on both ends in a longitudinal direction for connecting with an electrical and electronic apparatus. Wires for connecting between the terminal portions formed on the both ends are formed to have a pattern along a longitudinal direction.

With a recent trend for a miniaturized electrical and electronic apparatus, there is a growing demand to mount a flexible wired circuit board in a smaller space. To meet the requirement, bending portions are formed on a flexible wired circuit board, which causes the profile thereof to be more complex.

On the other hand, as disclosed in Japanese Unexamined Patent Publication No. 2002-217503, a plurality of printed circuit boards formed on a worksheet may create a dead space therebetween in the case where each of the printed circuit boards has a complex outer shape and less numbers of the printed circuit boards are formed per worksheet. This reduces the yield of the printed circuit board per worksheet, and the production efficiency, thereby increasing the production costs.

SUMMARY OF THE INVENTION

It is an object of the present invention to provide a flexible wired circuit board that increases the yield of the wired circuit board per sheet, and the production efficiency to reduce the production costs when a plurality of flexible wired circuit boards are formed and aligned on a sheet.

The flexible wired circuit board of the present invention comprises a first wired circuit board portion having a first terminal portion, a second wired circuit board portion having a second terminal portion, and a connecting portion for connecting the first wired circuit board portion and the second wired circuit board portion, wherein the first wired circuit board portion and the second wired circuit board portion are disposed adjacent to each other at one end of the connecting portion, and the first wired circuit board portion is foldable over the other end with respect to the connecting portion.

According to this flexible wired circuit board, when the first wired circuit board portion is folded over the other end with respect to the connecting portion, the first wired circuit board portion and the second wired circuit board portion are disposed at opposite sides of the board with respect to the connecting portion, ensuring a long distance between the first portion and the second terminal portion. By folding over the wiring circuit board, the flexible wired circuit board can be formed to have a complex profile, for example, with bending portions.

On the other hand, this flexible wired circuit board has the first wired circuit board portion and the second wired circuit board portion provided adjacent to each other at one end of the connecting portion and is formed in a compact profile before it is folded over. For this reason, when a plurality of flexible wired circuit boards are formed and aligned on a single worksheet, the formation area of each of the flexible wired circuit boards can be reduced, while dead spaces between the printed circuit boards can also be reduced.

As a result, according to the flexible wired circuit board of the present invention, it is possible to adapt a complex profile with bending portions and the like, and at the same time, to improve the yield and the production efficiency of the printed circuit board to reduce the production costs.

In the flexible wired circuit board of the present invention, it is preferable that the first wired circuit board portion and the second wired circuit board portion are disposed to face with an interval with each other, and a folding portion is provided in the first wired circuit board portion for folding the first wired circuit board portion over the other end with respect to the connecting portion along an opposing direction between the first wired circuit board portion and the second wired circuit board portion.

According to the flexible wired circuit board, the first wired circuit board portion and the second wired circuit board portion can be easily and reliably provided at the opposite side with each other with respect to the connecting portion to secure a long distance between the first terminal portion and the second terminal portion, only by folding the first wired circuit board portion over the other side with respect to the connecting portion along the opposing direction between the first wired circuit board portion and the second wired circuit board portion at a folding portion.

In the flexible wired circuit board of the present invention, it is further preferable that, the folding portion is provided at a connecting portion side end of the first wired circuit board portion.

As described above, when the folding portion is provided at the connecting portion side end of the first wired circuit board portion, folding of the first wired circuit board portion over the other side with respect to the connecting portion along the opposing direction between the first wired circuit board portion and the second wired circuit board portion at a folding portion secures the maximum distance between the first terminal portion and the second terminal portion.

DETAILED DESCRIPTION OF THE PREFERRED EMBODIMENT

Figure 1:
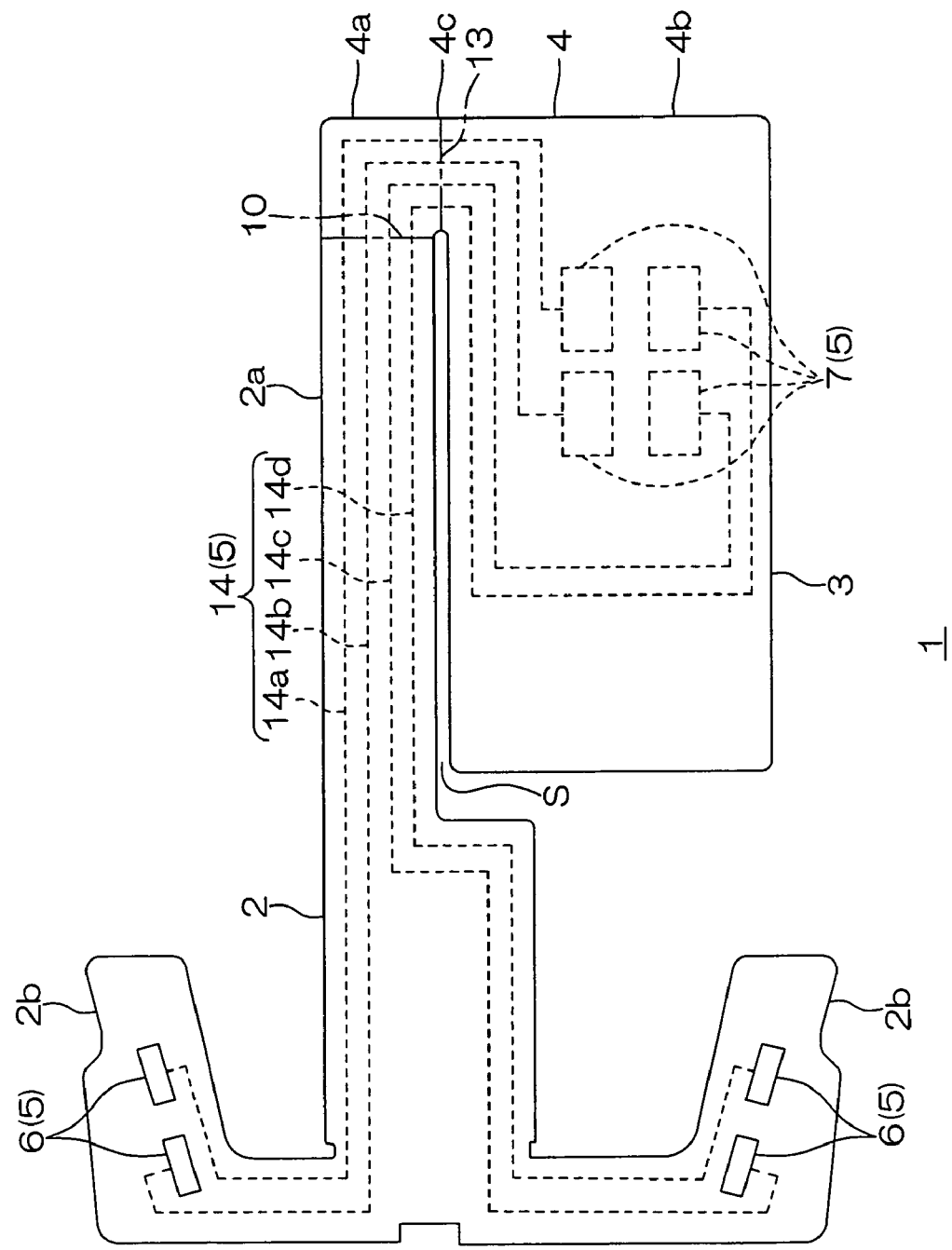
FIG. 1 is a plan view of a flexible wired circuit board of an embodiment of the present invention.
Figure 2:
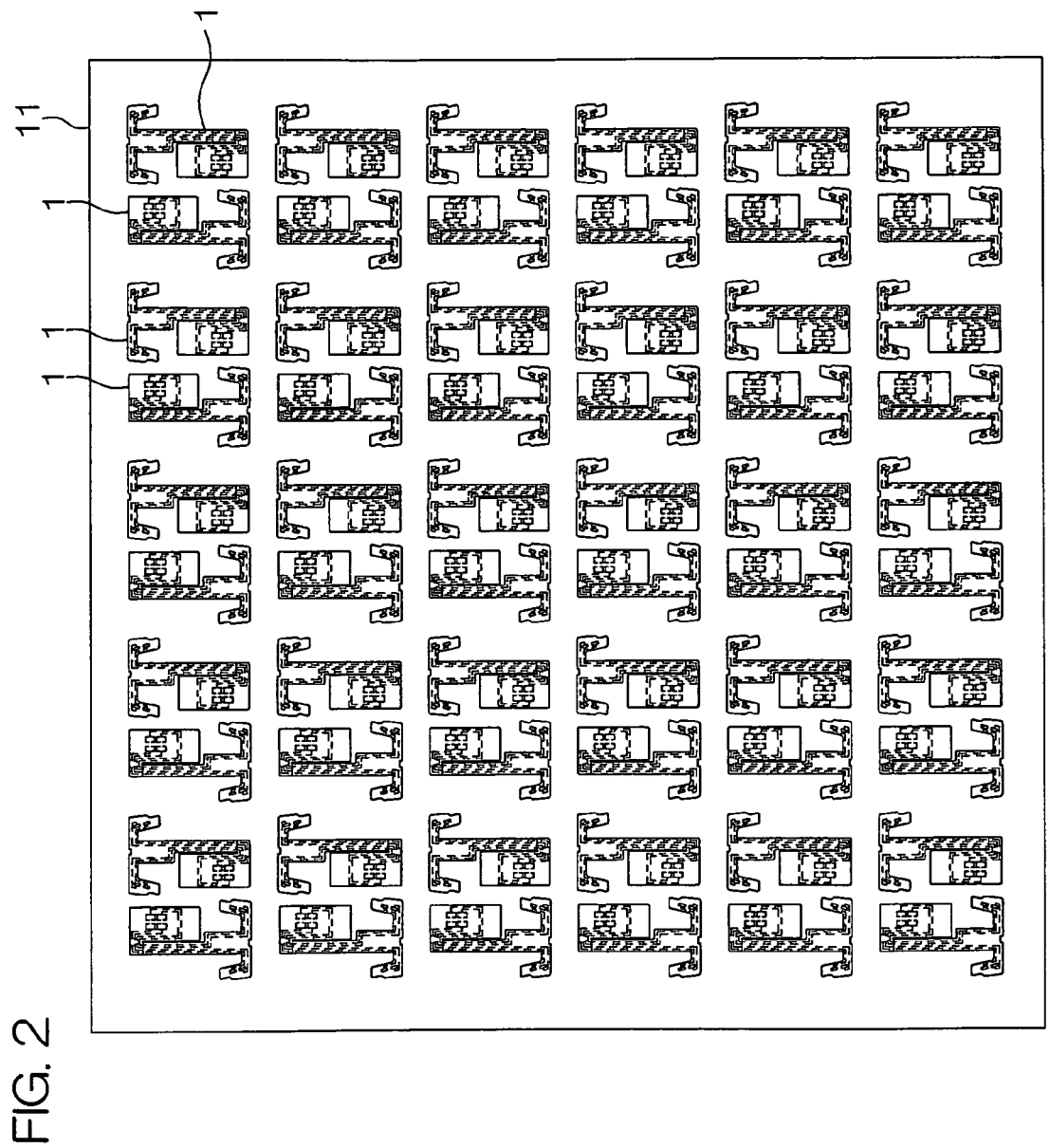
FIG. 2 is a plan view of a flexible wired circuit board formation sheet of an embodiment on which a plurality of flexible wired circuit boards shown in FIG. 1 are formed and aligned.
Figure 3:
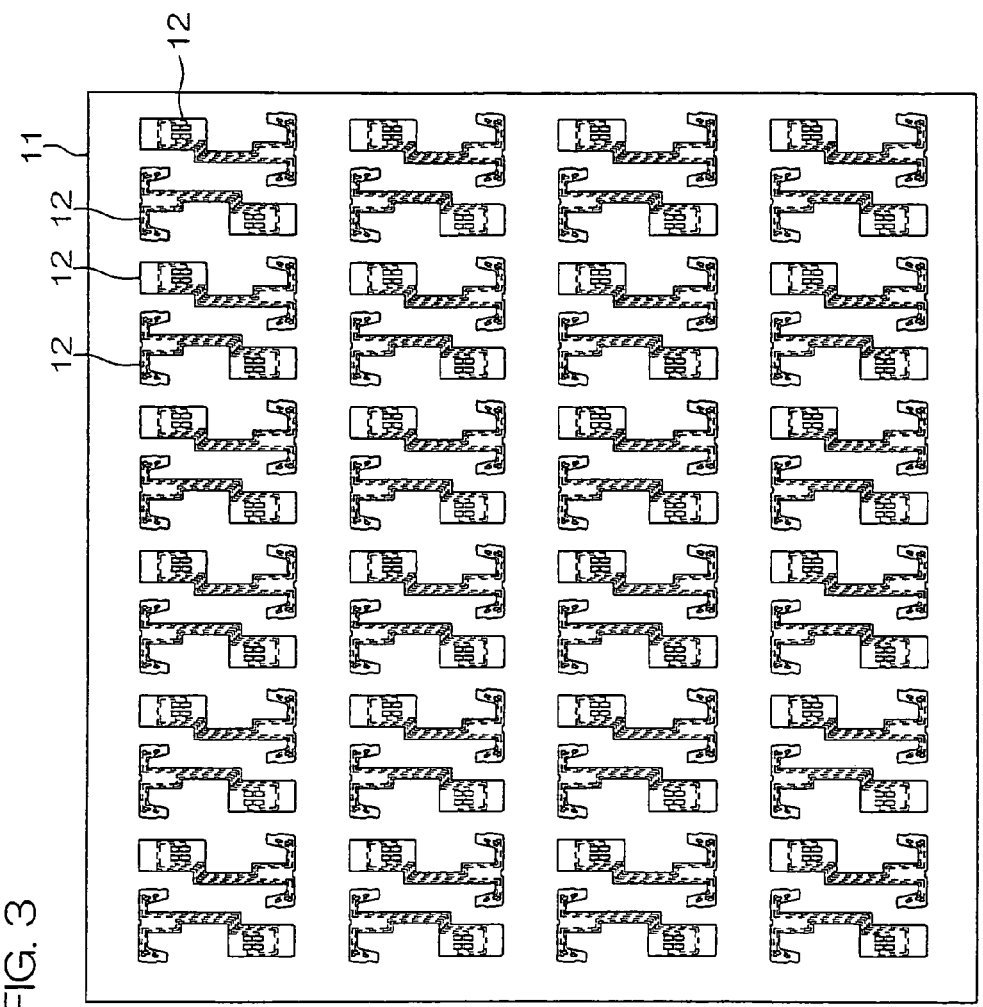
FIG. 3 is a plan view of a flexible wired circuit board formation sheet of an embodiment on which a plurality of conventional flexible wired circuit boards are formed and aligned.
Figure 4:
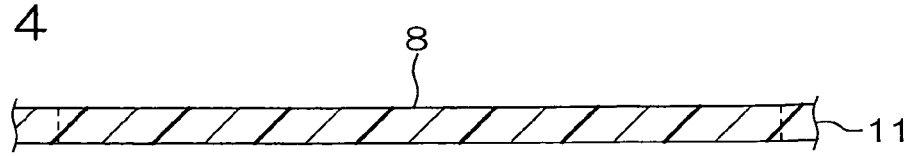
FIG. 4 is a production process drawing showing a production process of the flexible wired circuit board shown in FIG. 1 in which a longitudinal sectional view along one wire is shown, (a) showing the process of preparing a sheet to be formed as an insulating base layer, (b) showing the process of forming a conductive pattern in a pattern of a wiring circuit, (c) showing the process of forming an insulating cover layer on the sheet so as to open a portion corresponding to a first terminal portion and cover the conductive pattern other than the first terminal portion, (d) showing the process of etching a portion of the sheet corresponding to a second terminal portion, (e) showing the process of punching out the sheet and the insulating cover layer into a shape corresponding to the profile of each of the flexible wired circuit board and obtain the individual flexible wired circuit board.
Figure 4:
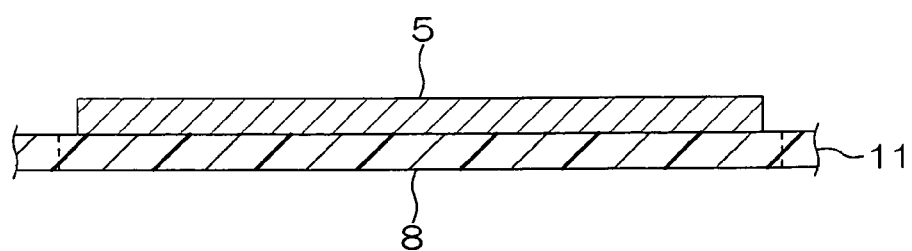
Figure 4:
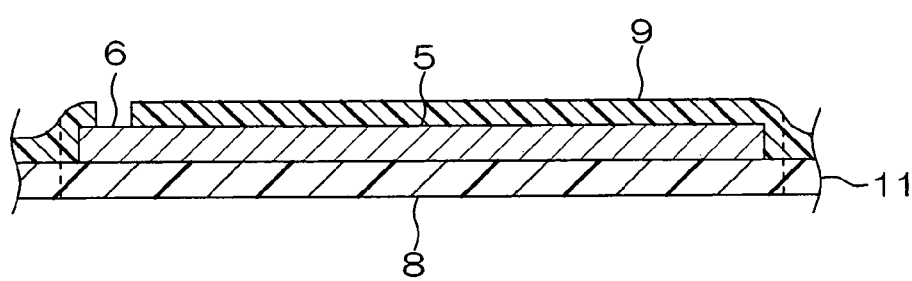
Figure 4:
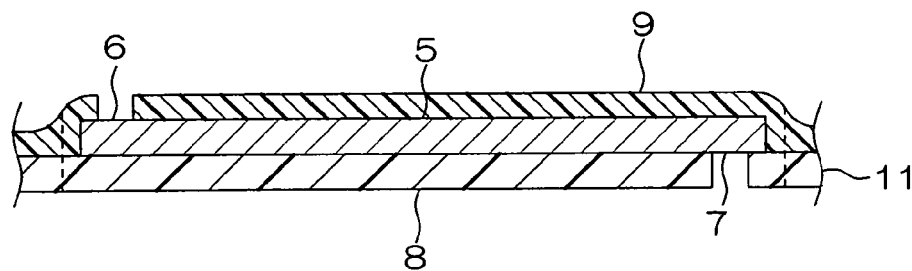
Figure 4:
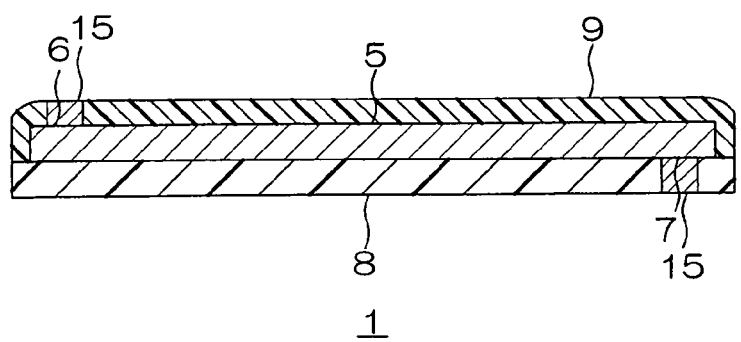

FIG. 1 is a plan view of a flexible wired circuit board of an embodiment of the present invention, FIG. 2 is a plan view of a flexible wired circuit board formation sheet of an embodiment on which a plurality of flexible wired circuit boards shown in FIG. 1 are formed and aligned, FIG. 3 is a plan view of a flexible wired circuit board formation sheet of an embodiment on which a plurality of conventional flexible wired circuit boards are formed and aligned, and FIG. 4 is a production process drawing showing a production process of the flexible wired circuit board of the present invention in which a longitudinal sectional view along one wire in FIG. 1 is shown.

In FIG. 1, the flexible wired circuit board 1 is used for an electrical and electronic apparatus, for example, and comprises a first wired circuit board portion 2 including a first terminal portion 6, a second wired circuit board portion 3 including a second terminal portion 7, and a connecting portion 4 for connecting the first wired circuit board portion 2 and the second wired circuit board portion 3, which are integrally formed.

As shown in FIG. 1, the first wired circuit board portion 2 is formed in a generally T-shape as seen from top and includes a strip portion 2a extending in a longitudinal direction, and two branched portions 2b that are branched in the orthogonal direction at one end of the strip portion 2a. Two first terminal portions 6 are provided at a free end portion of each branched portion 2b of the first wired circuit board portion 2, respectively.

The second wired circuit board portion 3 is formed in a generally rectangular shape (oblong shape) as seen from top. Four second terminal portions 7 are provided at a portion slightly closer to the other side from the central portion, and each of the four second terminal portions 7 is aligned in a generally rectangular manner as seen from top.

The second wired circuit board portion 3 is provided to face the first wired circuit board portion 2 with a very narrow slit S therebetween so as to be parallel to the longitudinal direction of the strip portion 2a.

The connecting portion 4 is formed in generally long rectangular shape as seen from top, and continuously connects with the other end of the first wired circuit board portion 2 in a longitudinal direction and with the other end of the second wired circuit board portion 3 in a longitudinal direction. The connecting portion 4 integrally includes a first portion 4a that continues from the other end in a longitudinal direction of the strip portion 2a of the first wired circuit board portion 2 along the longitudinal direction of the strip portion 2a, a second portion 4b that continues from the other end in a longitudinal direction of the second wired circuit board portion 3 along a longitudinal direction of the second wired circuit board portion 3, and an intermediate portion 4c that connects the first portion 4a and the second portion 4b in a orthogonal direction of the longitudinal direction of the first wired circuit board portion 2 and the second wired circuit board portion 3.

The slit S is formed between the first wired circuit board portion 2 and the second wired circuit board portion 3 as a long slit that has one end opened and the other end closed by the intermediate portion 4c.

The first wired circuit board portion 2 and the second wired circuit board portion 3 are provided adjacent to each other in an opposed direction at one side of the connecting portion 4.

In the first wired circuit board portion 2, a folding portion 10 is provided in the middle of the longitudinal direction of the strip portion 2a, along the opposed direction between the first wired circuit board portion 2 and the second wired circuit board portion 3 (a direction orthogonal to the longitudinal direction of the strip portion 2a) to fold the first wired circuit board portion 2 over the other end with respect to the connecting portion 4.

The folding portion 10 is provided at the middle of the longitudinal direction of the first wired circuit board portion 2 (that is, between the branched portion 2b and the first portion 4a in the strip portion 2a), and more specifically, at the other end of the strip portion 2a of the first wired circuit board portion 2, that is, the connecting portion 4 side end of the first wired circuit board portion 2.

Specifically, the folding portion 10 is provided as a straight folding portion along a direction orthogonal to the longitudinal direction of the strip portion 2a at the other end of the strip portion 2a of the first wired circuit board portion 2. The folding portion is provided for example, as an indication line for bending or as a cutting line.

In addition, in the connecting portion 4, a bending portion 13 is provided at the intermediate portion 4c along a longitudinal direction of the first wired circuit board portion 2 and the second wired circuit board portion 3 (a direction orthogonal to the opposed direction of the first wired circuit board portion 2 and the second wired circuit board portion 3) to bend the second wired circuit board portion 3 at a generally right angle with respect to the first wired circuit board portion 2.

The bending portion 13 is provided at the intermediate portion 4c of the connecting portion 4. More specifically, the bending portion 13 is provided as a straight bending portion along the longitudinal direction of the slit S on an extended line in the longitudinal direction of the slit S between the first wired circuit board portion 2 and the second wired circuit board portion 3 at the connecting portion 4. The bending portion is provided as an indication line for bending or as a cutting line as in the case of the folding portion mentioned above.

The flexible wired circuit board 1 includes, as shown in FIG. 4(e), an insulating base layer 8, a conductive pattern 5 formed on the surface of the insulating base layer 8 as a wired circuit pattern, and an insulating cover layer 9 formed on the surface of the insulating base layer 8 so as to cover the conductive pattern 5.

The insulating base layer 8, which is shown in FIG. 4 and described later, is formed in a shape of a profile of the flexible wired circuit board 1.

The conductive pattern 5 includes the first terminal portions 6 and the second terminal portions 7 mentioned above, and a wiring 14 that connects between the first terminal portions 6 and the second terminal portions 7.

The wiring 14 is provided as four wires 14a, 14b, 14c, and 14d extending from the branched portion 2b of the first wired circuit board portion 2 through the strip portion 2a, the first portion 4a, the intermediate portion 4c, and the second portion 4b to the second wired circuit board portion 3, so that they respectively connects each of the four first terminal portions 6 provided at the free end of each branched portion 2b of the first wired circuit board portion 2 with each of the four second terminal portions 7 provided in the second wired circuit board portion 3.

The insulating cover layer 9 is formed in a shape of the profile of the flexible wired circuit board 1 corresponding to the insulating base layer 8.

As shown in FIG. 4(e), the portion of the insulating cover layer 9 that corresponds to the first terminal portion 6 is opened such that the upper surface of the first terminal portion 6 is exposed. On the other hand, the portion of the insulating base layer 8 that corresponds to the second terminal portion 7 is opened such that the lower surface of the second terminal portion 7 is exposed. A metal plating layer 15 is formed on the upper surface of the first terminal portion 6 and the lower surface of the second terminal portion 7, respectively.

In the production process, a plurality of such flexible wired circuit boards 1 are formed on a single sheet 11 (flexible wired circuit board formation sheet) as shown in FIG. 2.

The production process of such flexible wired circuit board 1 is briefly described hereinafter with reference to FIG. 4.

In this process, as shown in FIG. 4(a), a planar sheet 11 for forming the insulating base layer 8 is prepared (Cf. FIG. 2). The sheet 11 may be formed of any insulating and flexible materials, including, but not limited to, resin films, for example, polyimide resin, acrylic resin, polyether-imide resin, polyether-nitrile resin, polyether-sulfone resin, polyether-terephthalate resin, polyether-naphthalate resin, and polyvinyl chloride resin. Of these resin films, polyimide resin is preferably used for the sheet 11. The polyimide resin film has a thickness of, for example, 5 to 100 µm, or preferably, 5 to 50 µm.

Next, in this process as shown in FIG. 4(b), the conductive pattern 5 is formed on the sheet 11 as the wiring circuit pattern mentioned above corresponding to each flexible wired circuit board 1. The conductive pattern 5 may be formed of any conductive materials, including, but not limited to, metal foils, for example, copper, chromium, nickel, aluminum, stainless steel, copper-beryllium, phosphor bronze, iron-nickel, or alloys thereof. Of these metal foils, copper is preferably used for the conductive pattern 5. The conductive pattern 5 has a thickness of, for example, 1 to 50 µm, or preferably, 2 to 35 µm.

The conductive pattern 5 is formed by a known patterning method such as an additive method or a subtractive method.

In the subtractive method, for example, a conductor layer is adhesively bonded to the entire surface of the sheet 11 via an adhesive layer, if necessary. Then on the conductor layer, an etching resist that corresponds to each of the wiring circuit pattern of the flexible wired circuit board 1 is formed, and the conductor layer exposed from the etching resist is etched. The conductive pattern 5 is thus formed as a wiring circuit pattern corresponding to each flexible wired circuit board 1 on the sheet 11. The etching resist is then removed.

In the additive method, a seed film of a conductor is formed on the sheet 11 by sputter vapor deposition, for example, first. Then a plating resist is formed on the seed film so as to have a reverse pattern to each wiring circuit pattern of the flexible wired circuit board 1. Then, the conductive pattern 5 corresponding to each flexible wired circuit board 1 is formed to have a wiring circuit pattern on the seed film exposed from the plating resist by electrolytic plating. Thereafter, the plating resist and the seed film on which the plating resist is laminated are removed.

Then, as shown in FIG. 4(c), the insulating cover layer 9 is formed so as to correspond to each flexible wired circuit board 1 on the sheet 11 including the conductive pattern 5. The insulating cover layer 9 may be formed of any insulating and flexible materials, including, but not limited to, resin films similar to the insulating base layer 8, and polyimide resin film is preferably used for the insulating cover layer 9. The insulating cover layer 9 has a thickness of, for example, 5 to 100 µm, or preferably, 5 to 50 µm.

Further, forming the insulating cover layer 9 is not limited to any method. For example, a photosensitive resin solution (for example, a solution of photosensitive polyimide resin, photosensitive polyester resin and the like) is applied over the surface of the sheet 11 including the conductive pattern 5, and exposed to light and developed to form a coat pattern having an opening for the first terminal portion 6 to be opened. Then the coat is dried and cured. The insulating cover layer 9 of synthetic resin film such as polyimide resin or polyester resin is thus obtained in the manner mentioned above. Alternatively, the insulating cover layer 9 may be formed by adhesively bonding a resin film to have the pattern mentioned above on the sheet 11 via an adhesive layer.

Subsequently, an etching resist is formed on the surface of the sheet 11 other than the portion that corresponds to the second terminal portion 7. The sheet 11 is etched using this etching resist as a resist, whereby an opening for the second terminal portion 7 is opened as shown in FIG. 4(d). Any types of etching may be conducted, and chemical etching is preferably used.

As shown in FIG. 4(e), the sheet 11 and the insulating cover layer 9 are punched out in a shape corresponding to the shape of individual flexible wired circuit board 1 by way of, for example, a punch-out die or the like, whereby a plurality of flexible wired circuit boards 1 which the insulating base layer 8 is formed in the shape of the profile of flexible wired circuit boards 1 are obtained.

Alternatively, a metal plating layer 15 may be formed at the first terminal portion 6 and the second terminal portion 7 as appropriate. For forming the metal plating layer 15, metals such as gold or nickel are used. The metal plating layer 15 may be formed by electroless plating or electrolytic plating.

Further, in the description mentioned above, the flexible wired circuit board 1 is formed such that the first terminal portion 6 is exposed from the insulating cover layer 9 and the second terminal portion 7 is exposed from the insulating base layer 8. However, the flexible wired circuit board 1 may be formed such that the first terminal portion 6 is exposed from the insulating base layer 8 and the second terminal portion 7 is exposed from the insulating cover layer 9.

Figure 5:
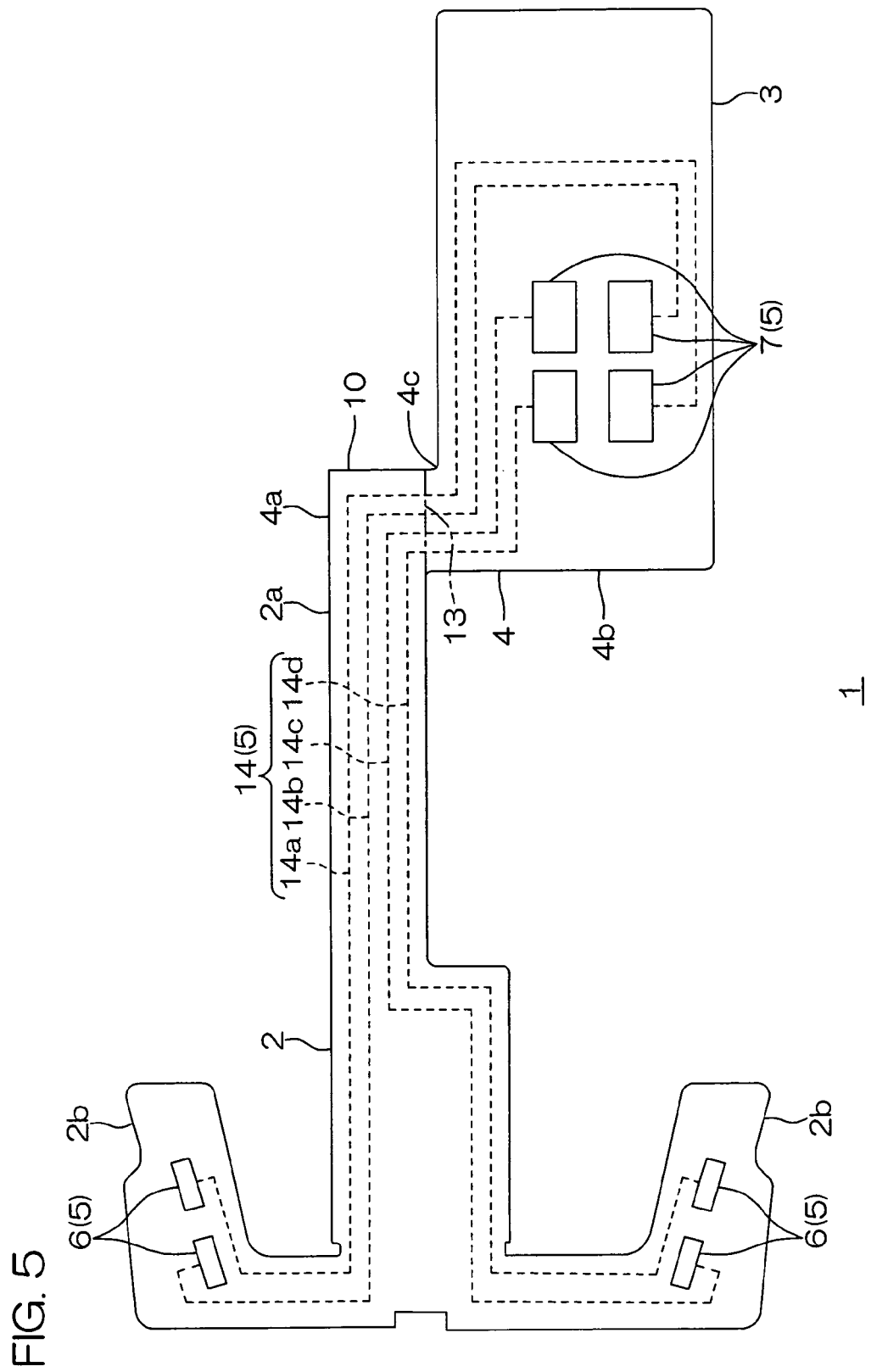
FIG. 5 is a plan view of a flexible wired circuit board in FIG. 1 showing the first wired circuit board portion to be folded over the other end with respect to the connecting portion at the folding portion.

In the flexible wired circuit board 1 thus obtained, when in use, the first wired circuit board portion 2 is folded over the other end with respect to the connecting portion 4 at the folding portion 10 serving as a boundary. The first portion 4a of the connecting portion 4 and the other end side of the strip portion 2a of the first wired circuit board portion 2 are thus overlapped with each other as shown in FIG. 5.

By folding over, the first terminal portion 6 exposed from the insulating cover layer 9 and the second terminal portion 7 exposed from the insulating base layer 8 are exposed on the same side of the flexible wired circuit board 1 in a vertical direction.

With this manner, in the flexible wired circuit board 1, the first wired circuit board portion 2 and the second wired circuit board portion 3 are disposed at an opposed side from each other with respect to the connecting portion, whereby this ensures a long distance between the first terminal portions 6 and the second terminal portions 7. Moreover, the flexible wired circuit board 1 with a complex profile such as an "L" shape crank as seen from top like a conventional flexible wired circuit board 12 can be obtained.

Furthermore, in the flexible wired circuit board 1 before it is folded, the first wired circuit board portion 2 and the second wired circuit board portion 3 are disposed adjacent to each other at one side of the connecting portion 4 to form a compact profile. Therefore, in the case where a plurality of flexible wired circuit boards 1 are formed and aligned on the sheet 11 as shown in FIG. 2, the formation area of each of the flexible wired circuit boards 1 can be reduced, while dead spaces between the wired circuit boards 1 can also be reduced.

As a result, when a plurality of flexible wired circuit boards 1 are formed and aligned on the sheet 11, as shown in FIG. 2 for example, flexible wired circuit boards 1 in a matrix of six in a row and ten in a line are aligned to yield a total of sixty flexible wired circuit boards 1 per sheet. On the other hand, when a plurality of conventional flexible wired circuit boards of "L" shape crank as seen from top are formed on the sheet 11, as shown in FIG. 3, flexible wired circuit boards in a matrix of four in a row and twelve in a line are aligned to yield a total of only forty-eight flexible wired circuit boards per sheet. Accordingly, the flexible wired circuit board 1 of the present invention can increase yields of the flexible wired circuit boards by twelve per sheet.

In the flexible wired circuit board 1 thus obtained, the bending portion 13 is provided at the intermediate portion 4c of the connecting portion 4. In the folding portion 10, the first wired circuit board portion 2 is folded over the other end side with respect to the connecting portion 4. Then, the second wired circuit board portion 3 is bent at a generally right angle with respect to the first wired circuit board portion 2 at the bending portion 13, the flexible wired circuit board 1 can be mounted in a smaller space As described above, according to the flexible wired circuit board 1, it is possible to adapt a complex profile such as bending portions and the like, and at the same time, to improve the yield per unit area of the sheet 11 of the flexible wired circuit board 1 and the production efficiency and thus to reduce the production costs.

In the flexible wired circuit board 1, the folding portion 10 is disposed along the opposing direction of the first wired circuit board portion 2 and the second wired circuit board portion 3. With this arrangement, only by folding the first wired circuit board portion 2 over along the opposed direction of the first wired circuit board portion 2 and the second wired circuit board portion 3 only one time with respect to connecting portion 4 at the folding portion 10, the distance between the first terminal portions 6 and the second terminal portions 7 can be equally ensured to the distance between terminals in the conventional flexible wired circuit board 12.

Particularly, because the folding portion 10 is provided at the other end side of the first wired circuit board portion 2, the distance between the first terminal portions 6 and the second terminal portion 7 is ensured maximum.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A flexible wired circuit board comprising:
    a first wired circuit board portion having at one end a first terminal portion;
    a second wired circuit board portion having a second terminal portion; and
    a connecting portion for the first wired circuit board portion and the second wired circuit board portion, wherein:
    the first wired circuit board portion, the second wired circuit board portion, and the connecting portion comprise:
        a conductive pattern of metal, including the first terminal portion, the second terminal portion, and a wiring that connects between the first terminal portion and the second terminal portion, and
        an insulating base layer and an insulating cover layer for sandwiching the conductive pattern,
    the first terminal portion has an upper surface only exposed from a first opening in the insulating cover layer,
    the second terminal portion has a lower surface only exposed from a second opening in the insulating base layer,
    the first wired circuit board portion and the second wired circuit board portion are disposed adjacent to each other at one side of the connecting portion,
    and the first wired circuit board portion is folded only a single time over the other end thereof with respect to the connecting portion, such that the first terminal portion exposed through the first opening in the insulating cover layer and the second terminal portion exposed through the second opening in the insulating base layer are exposed on a same side of the flexible wired circuit board after the first wired circuit board portion is folded only once, when the flexible wired circuit board is in a final, operative state.

2. The flexible wired circuit board according to claim 1, wherein the first wired circuit board portion and the second wired circuit board portion are disposed to face with an interval with each other,
    and a folding portion is provided in the first wired circuit board portion for folding the first wired circuit board portion over the other end with respect to the connecting portion along an opposing direction of the first wired circuit board portion and the second wired circuit board portion.

3. The flexible wired circuit board according to claim 2, wherein the folding portion is provided at a connecting portion side end of the first wired circuit board portion.

* * * * *